United States Patent
Son et al.

(10) Patent No.: US 12,266,512 B2
(45) Date of Patent: Apr. 1, 2025

(54) PLASMA PROCESSING APPARATUS

(71) Applicant: SEMES CO., LTD., Chungcheongnam-do (KR)

(72) Inventors: Dukhyun Son, Cheonan-si (KR); Jaewon Shin, Seoul (KR); Hyungjoon Kim, Pyeongtaek-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 16 days.

(21) Appl. No.: 18/190,442

(22) Filed: Mar. 27, 2023

(65) Prior Publication Data

US 2023/0317428 A1 Oct. 5, 2023

(30) Foreign Application Priority Data

Apr. 1, 2022 (KR) .................. 10-2022-0041230

(51) Int. Cl.
*H01J 37/32* (2006.01)
*H01J 37/34* (2006.01)

(52) U.S. Cl.
CPC .... *H01J 37/32669* (2013.01); *H01J 37/3244* (2013.01); *H01J 37/32458* (2013.01); *H01J 37/3455* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,190,495 B1 | 2/2001 | Kubota | |
| 11,542,592 B2 | 1/2023 | Shinada | |
| 2002/0017910 A1* | 2/2002 | Sakai | H01J 37/3266 204/192.2 |
| 2007/0175749 A1* | 8/2007 | Schneider | H01J 37/3408 204/192.1 |

(Continued)

FOREIGN PATENT DOCUMENTS

| | | |
|---|---|---|
| JP | 3375302 B2 | 2/2003 |
| JP | 4107518 B2 | 6/2008 |
| KR | 10-2012-0105219 A | 9/2012 |

(Continued)

OTHER PUBLICATIONS

Written Decision on Registration dated Mar. 21, 2024 issued in corresponding KR Patent Application No. 10-2022-0041230, with English translation.

*Primary Examiner* — Jason Berman
(74) *Attorney, Agent, or Firm* — Carter, DeLuca & Farrell LLP (57) ABSTRACT

According to an aspect of the inventive concept, there is provided a plasma processing apparatus including a housing including a space accommodating a wafer therein, a gas supply member configured to supply gas into the housing, a plasma source generating a plasma from the gas supplied into the housing, and a magnetic field generating member disposed on the housing and configured to generate a magnetic field inside the housing, wherein the magnetic field generating member includes a first magnet unit disposed on the housing, and a second magnet unit disposed on the first magnet unit, wherein the second magnet unit is rotatable to change the magnetic pole of the upper portion and lower portion of the second magnet unit.

20 Claims, 6 Drawing Sheets

(56) References Cited

U.S. PATENT DOCUMENTS

2012/0181166 A1    7/2012  Luo

FOREIGN PATENT DOCUMENTS

| KR | 2012105219 A | * | 9/2012 |
| KR | 10-2015-0023263 A | | 3/2015 |
| KR | 10-2018-0003249 A | | 1/2018 |
| KR | 10-2297165 B1 | | 9/2021 |

* cited by examiner

PLASMA PROCESSING APPARATUS

CROSS-REFERENCE TO RELATED APPLICATION

This application is based on and claims priority under 35 U.S.C. § 119 to Korean Patent Application No. 10-2022-0041230, filed on Apr. 1, 2022, in the Korean Intellectual Property Office, the disclosure of which is incorporated by reference herein in its entirety.

BACKGROUND

1. Field

The inventive concept provides a plasma processing apparatus, and more particularly, to a plasma processing apparatus capable of controlling a size of a magnetic field.

2. Description of the Related Art

Semiconductor devices may be prepared by forming a certain pattern on the substrate. When forming a certain pattern on the substrate, a plasma may be generated by a variety of processes, such as a depositing process, a lithography process, an etching process, etc. and the generated plasma may be provided on a semiconductor substrate such as a wafer to thereby deposit a thin film on the wafer or remove thin films such as oxide layers or contaminants from the semiconductor substrate.

Recently, various devices that add magnetic fields to a plasma region have been used to improve the characteristics of the plasma. A magnetic field may accommodate the plasma in a chamber to reduce damage to an inner wall of the chamber caused by the plasma. In addition, the magnetic field may activate movements of the electron, helping to generate and maintain the plasma, thereby increasing plasma density. In addition, the magnetic field may make the plasma uniformly distributed in the chamber to improve etching uniformity or deposition uniformity in an entire wafer region.

It is difficult for the current method of providing a magnetic field in a plasma processing apparatus to change the shape or intensity of the magnetic field.

SUMMARY

An aspect of the inventive concept provides a plasma processing apparatus capable of controlling the size of the magnetic field by controlling relative location locations of a plurality of magnet units.

More particularly, provided is a plasma processing apparatus capable of controlling the size of the magnetic field by controlling the relative location of a magnetic pole of the magnet unit.

Additional aspects will be set forth in part in the description which follows and, in part, will be apparent from the description, or may be learned by practice of the presented embodiments of the disclosure.

According to one or more embodiments, a plasma processing apparatus includes a housing comprising a space accommodating a wafer therein, a gas supply member configured to supply gas into the housing, a plasma source generating a plasma from the gas supplied into the housing, and a magnetic field generating member disposed on the housing and configured to generate a magnetic field inside the housing, wherein the magnetic field generating member includes a first magnet unit disposed on the housing, and a second magnet unit disposed on the first magnet unit, wherein the second magnet unit is rotatable to change the magnetic pole of the upper portion and lower portion of the second magnet unit.

According to one or more embodiments, the plasma processing apparatus may further include a controller configured to control a relative location of the magnetic pole of the second magnet unit to control a size of the magnetic field of the magnetic field generating member.

According to one or more embodiments, the first magnet unit may include at least one first magnet disposed on the housing, and the second magnet unit may include at least one second magnet disposed on the first magnet unit.

According to one or more embodiments, the first magnet and the second magnet may be permanent magnets.

According to one or more embodiments, the first magnet may be symmetric to a center of the first magnet, and the second magnet may be symmetric to a center of the second magnet.

According to one or more embodiments, the magnetic poles disposed in an upper portion and lower portion of the first magnet unit may be different from each other.

According to one or more embodiments, the plasma processing apparatus may further include a rotating member configured to rotate the second magnet unit.

According to one or more embodiments, a rotation shaft of the second magnet unit may be parallel to a horizontal direction.

According to one or more embodiments, the first magnet unit and the second magnet unit may be placed apart from each other in a vertical direction.

According to one or more embodiments, when viewed from a plane, the first magnet unit may surround the second magnet unit.

According to one or more embodiments, a surface of the first magnet unit facing the housing may be flat.

According to one or more embodiments, a plasma processing apparatus includes a housing including a space accommodating a wafer therein, a gas supply member configured to supply gas into the housing, a plasma source generating a plasma from the gas supplied into the housing, a magnetic field generating member disposed on the housing and configured to generate a magnetic field inside the housing, and a controller configured to control a size of the magnetic field of the magnetic field generating member, wherein the magnetic field generating member includes a first magnet unit disposed on the housing, a second magnet unit disposed on the first magnet unit, and a rotating member configured to rotate the second magnet unit, wherein the first magnet and the second magnet are permanent magnets, and the controller controls a relative location of a magnetic pole of the second magnet unit to control a size of the magnetic field of the magnetic field generating member.

According to one or more embodiments, the rotating member may include an actuator to transfer power and a shaft to transfer the power of the actuator to the second magnet.

According to one or more embodiments, the rotating member may include an electromagnet placed adjacent to a side of the second magnet, and the controller may control a direction and intensity of the magnetic pole of the electromagnet to control the rotating member.

According to one or more embodiments, the controller may alternately apply an on duty signal that rotates the second magnet unit and an off duty signal that does not rotate the second magnet unit to the rotating member.

According to one or more embodiments, the first magnet may have one of a ring shape, a donut shape, and a circular shape, and the second magnet may have one of a cylindrical shape and a sphere shape.

According to one or more embodiments, the plasma processing apparatus may further include a substrate support member placed inside the housing and supporting the wafer, wherein a center of at least one of the first magnet unit and the second magnet unit is aligned with a center of the substrate support member in a vertical direction.

According to one or more embodiments, a plasma processing apparatus includes a housing comprising a space accommodating a wafer therein, a substrate support member placed inside the housing and supporting the wafer, a gas supply member configured to supply gas into the housing, a plasma source generating a plasma from the gas supplied into the housing, a magnetic field generating member disposed on the housing and configured to generate a magnetic field inside the housing, and a controller configured to control the magnetic field generating member, wherein the magnetic field generating member includes a first magnet unit disposed on the housing, a second magnet unit disposed on the first magnet unit, and a rotating member configured to rotate the second magnet unit, wherein the first magnet and the second magnet are permanent magnets, and the controller controls the rotating member to control a relative location of the magnetic pole of the second magnet unit to control a size of the magnetic field of the magnetic field generating member, and a center of the magnetic field generating member is aligned with a center of the substrate support member in a vertical direction.

According to one or more embodiments, the first magnet may have a donut shape including a minor diameter and a major diameter, the minor diameter may range from about 50 mm to about 200 mm, and the major diameter may range from about 60 mm to about 240 mm.

According to one or more embodiments, the size of the magnetic field of each of the first magnet and the second magnet may range from about 100 gauss to about 1,000 gauss.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Effects, features, and a method of achieving the disclosure will be obvious by referring to embodiments of the disclosure with reference to the attached drawings. The disclosure may, however, be embodied in many different forms and should not be construed as being limited to the embodiments set forth herein. The present embodiments are provided to merely fully disclose the disclosure and to give those of ordinary skill in the art the full knowledge of the scope of the disclosure. The present disclosure is only defined by the scope of the claims. Throughout the specification, the same or corresponding components are assigned the same reference numerals.

Elements or layers are referred to as "on" another element or layer not only when elements are placed directly above the other element or layer but also when intervening elements or layers are present. On the other hand, an element may be referred to as "directly on" or "right above" when another intervening element or layer is not present.

As illustrated in the drawings, spatially relative terms such as "below", "beneath", "lower", "above", "upper", etc. may be used to easily describe the relation between elements or components and other devices or components. The spatially relative terms should be understood to include meanings of different directions of the element in addition to the direction shown in the drawing, when using or operating the element. For example, when an element shown in the drawing is overturned, the element described as "below" or "beneath" another element may be placed "above" the other element. Thus, the exemplary term "below" may include both below and above. The device may be placed to be oriented other directions, and spatially relative terms may be interpreted according to the orientation.

Although the first, second, etc. are used to describe a variety of devices, components, and/or sections, these devices, components, and/or sections are not limited by these terms. These terms are used only to distinguish a device, component, or section from other devices, components, or sections. Thus, within the technical concept of the disclosure, the first device, component, or section in the description below may be a second device, component, or section.

The terms used herein are for explaining embodiments and are not for purposes of limitation. In the disclosure, a singular form in a phrase includes a plural meaning unless mentioned particularly. The terms "comprises" and/or "comprising" provided herein means that a component, step, operation, and/or device does not exclude the presence or addition of at least one component, step, operation, and/or device.

Unless defined otherwise, all the terms used herein (including technical and scientific terms) may be used in a meaning that may be commonly understood by those of ordinary skill in the art. In addition, the commonly used terms defined in the dictionary are not ideally or excessively interpreted unless they are particularly defined.

Embodiments of the disclosure are explained in detail with reference to the accompanying drawings, and, in the drawings, like reference numerals demote like elements, and redundant descriptions thereof are omitted.

In the present embodiment, a wafer is described as an example of an object for plasma processing, and a plasma processing apparatus using a capacitively coupled plasma as a plasma source is described as an example. However, the technical concept of the disclosure is not limited thereto, and other types of substrates, such as a glass substrate, may be used, and various types of plasma sources, such as inductively coupled plasma, may be used.

Figure 1:
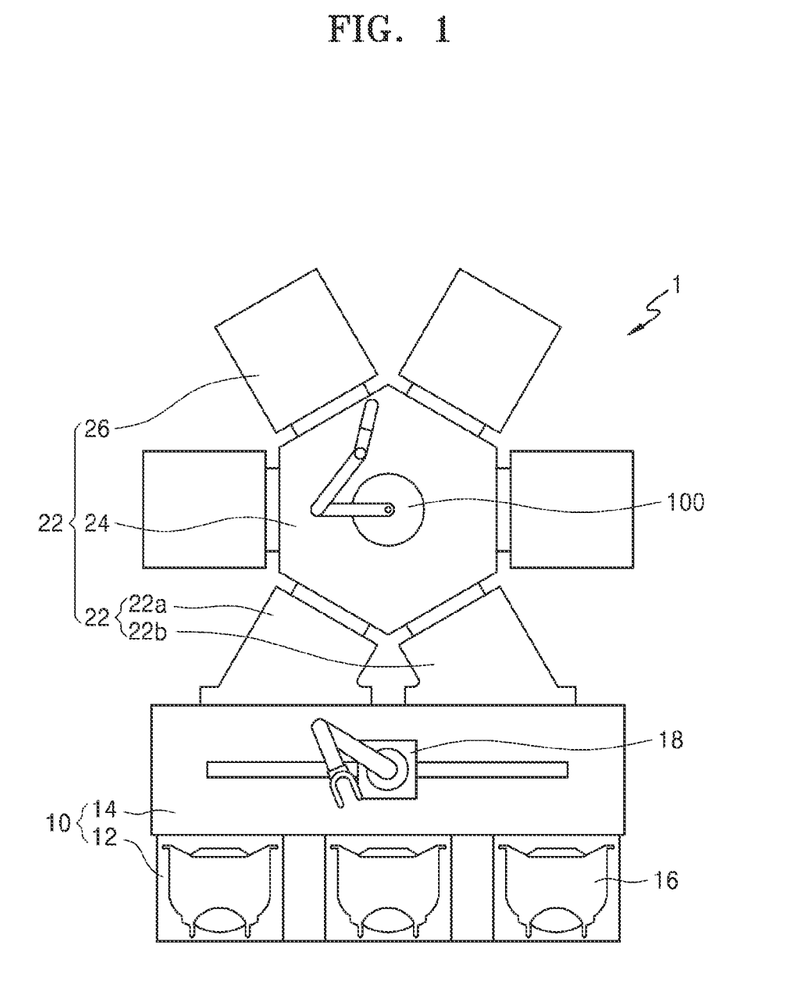
FIG. 1 is a schematic plan view of a substrate processing apparatus according to an embodiment.

FIG. 1 is a schematic plan view of a substrate processing apparatus 1 according to an embodiment.

Referring to FIG. 1, the substrate processing apparatus 1 may have an equipment front end module 10 and a process equipment 20.

The equipment front end module 10 may be mounted on a front of the process equipment 20 to transfer a wafer W between a container 16 in which the wafers are accommodated and the process equipment 20. The equipment front end module 10 may have a plurality of loadports 12 and a frame 14. The frame 14 may be located between the loadport 12 and the process equipment 20. The container 16 accommodating the wafer W may be placed on the loadport 12 through transport means (not shown) such as an overhead transfer, an overhead conveyor, or an automatic guided vehicle. A sealed container, such as a front open unified pod may be used as the container 16. A frame robot 18 that transfers the wafer W between the container 16, which is placed in the loadport 12, and the process equipment 20 may be installed in the frame 14. A door opener (not shown) that automatically opens and closes a door of the container 16 may be installed in the frame 14. In addition, a fan filter unit (not shown) that provides fresh air into the frame 14 such that the fresh air flows from the upper portion of the inside of the frame 14 to the lower portion of the inside of the frame 14 may be installed in the frame 14.

The process equipment 20 may include a loadlock chamber 22, a transfer chamber 24, and a process chamber 26. The transfer chamber 24 may generally have a polygonal shape when viewed from the top. The loadlock chamber 22 or the process chamber 26 may be located on the side of the transfer chamber 24.

The loadlock chamber 22 may located on a side of the transfer chamber 24 near the equipment front end module 10 among the sides of the transfer chamber 24, and the process chamber 26 may be located on other sides of the transfer chamber 24. The loadlock chamber 22 may be single or plural. In an embodiment, two loadlock chambers 22 may be provided. The wafers W being carrier into the process equipment 20 for processing may be accommodated in one of the two loadlock chambers 22, and the wafers W being carrier out of the process equipment 20 after completion of the processing may be accommodated in the other loadlock chamber 22. In contrast, a single loadlock chamber 22 or a plurality of the loadlock chambers 22 may be provided, and the wafer W may be loaded on or unloaded from each of the loadlock chambers 22.

The wafers W may be placed vertically apart from each other and to face each other in the loadlock chamber 22. A plurality of slots 22a supporting a portion of an edge of the wafer W may be provided in the loadlock chamber 22.

The interior of the transfer chamber 24 and the process chamber 26 are maintained in a vacuum, and the loadlock chamber 22 is converted into a vacuum and atmospheric pressure. The loadlock chamber 22 may prevent external contaminants from being introduced into the transfer chamber 24 and the process chamber 26. Gate valves (not shown) may be installed between the loadlock chamber 22 and the transfer chamber 24 and between the loadlock chamber 22 and the equipment front end module 10. When the wafer W is moved between the equipment front end module 10 and the loadlock chamber 22, the gate valve installed between the loadlock chamber 22 and the transfer chamber 24 is closed, and when the wafer W is moved between the loadlock chamber 22 and the transfer chamber 24, the gate valve installed between the loadlock chamber 22 and the equipment front end module 10 is closed.

The process chamber 26 may perform a certain process for the wafer W. For example, the process chamber 26 may perform the process by using a plasma, such as ashing, deposition, etching, or cleaning. A single or a plurality of the process chambers 26 may be provided on the side of the loadlock chamber 22. If a plurality of the process chambers 26 are provided, each process chamber 26 may perform the same process for the wafer W. If a plurality of the process chambers 26 are optionally provided, the process chambers 26 may sequentially perform a series of processes for the wafer W. Hereinafter, the process chamber 26, which performs the process by using the plasma, will be called a plasma processing apparatus.

Figure 2:
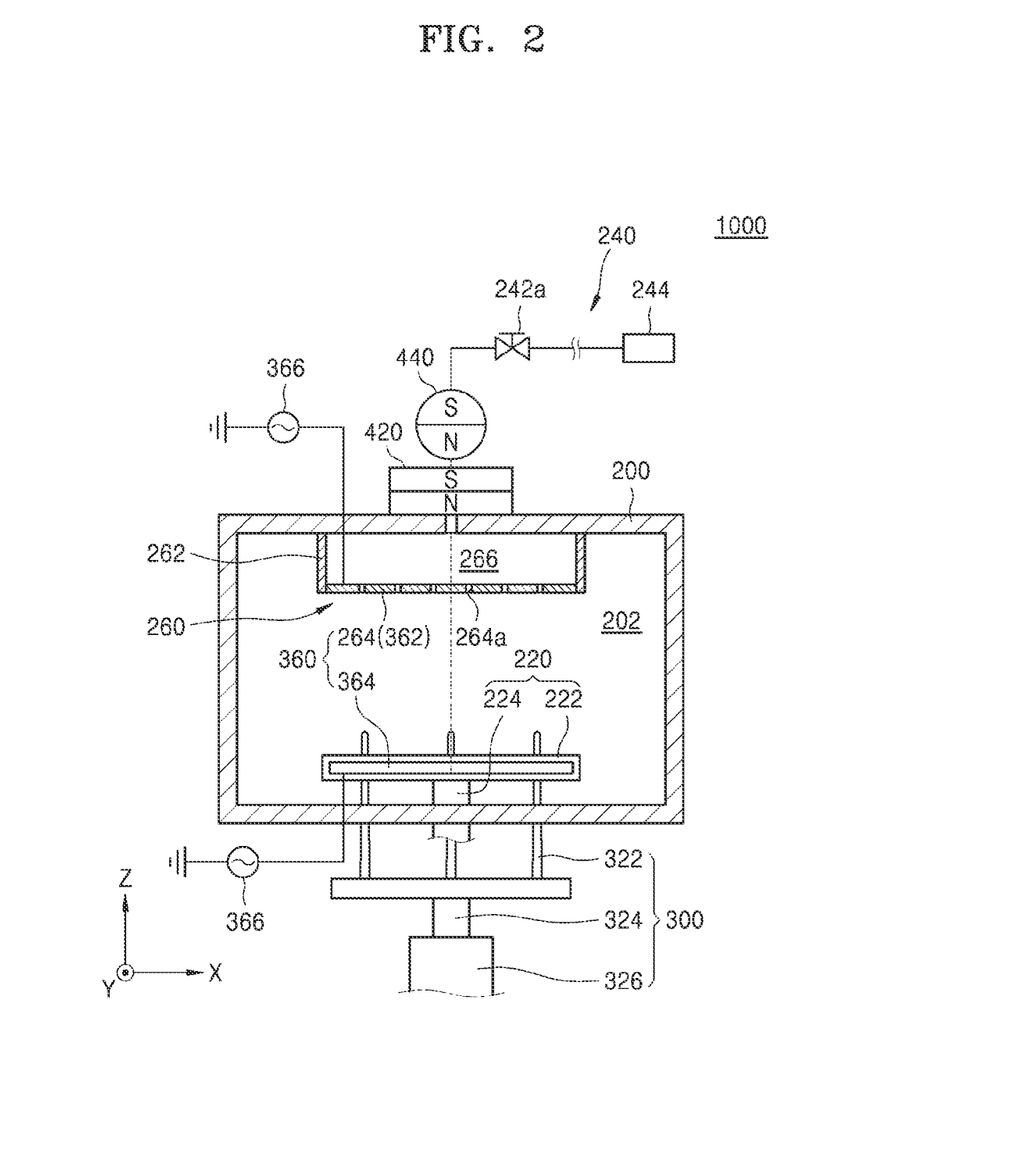
FIG. 2 is a schematic perspective view of an example of a plasma processing apparatus that performs an etching process for the wafer.
Figure 3:
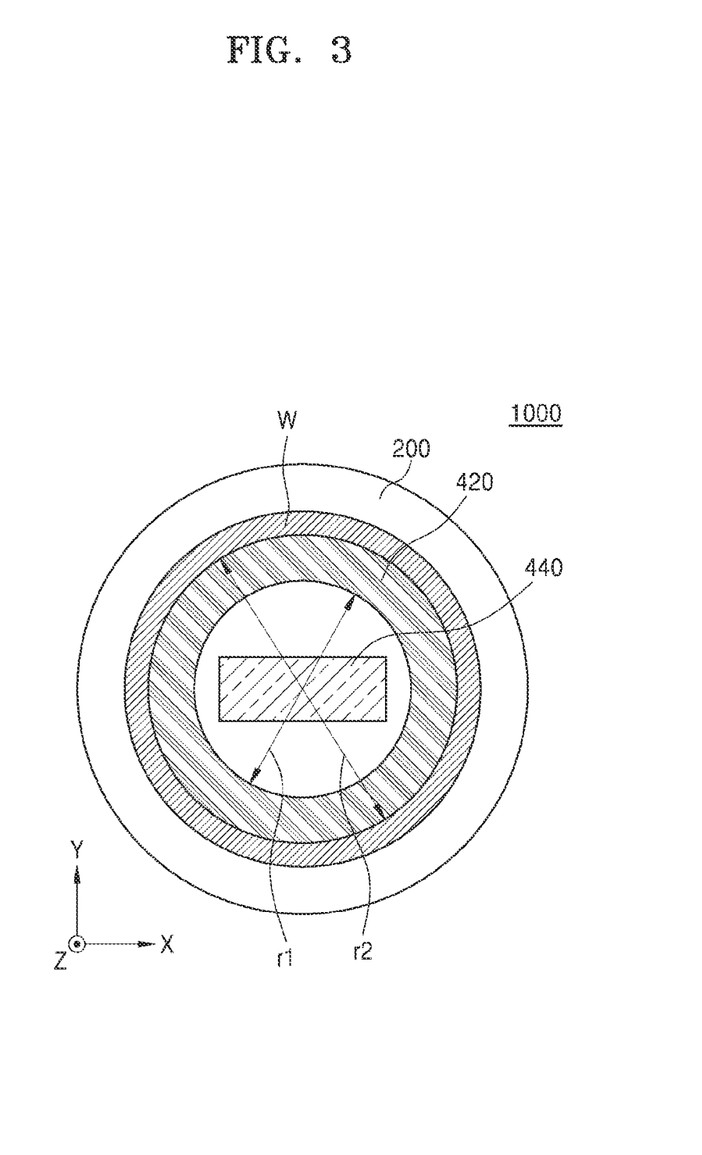
FIG. 3 is a plan view of a magnetic field generating member according to an embodiment.
Figure 4:
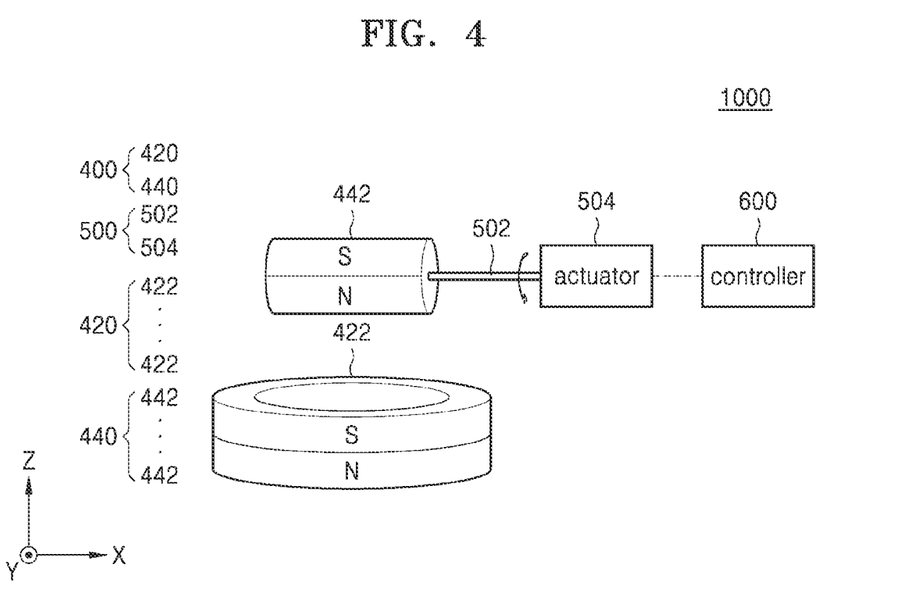
FIG. 4 is a schematic perspective view of a plasma processing apparatus including a rotating member, according to an embodiment.

FIG. 2 is a schematic perspective view of an example of a plasma processing apparatus 1000 that performs an etching process for the wafer W, and FIG. 3 is a plan view of a magnetic field generating member 400 according to an embodiment. FIG. 4 is a schematic perspective view of the plasma processing apparatus 1000 including a rotating member 500, according to an embodiment.

Referring to FIGS. 2 to 4, the plasma processing apparatus 1000 may include a housing 200, a support member 220, a gas supply member 240, a shower head 260, a plasma source 360, and the magnetic field generating member 400. The housing 200 has a cylindrical shape in which a space 202 in which the process is performed is provided. An exhaust pipe (not shown) that exhausts by-products caused by the performing of the process is connected to a lower wall of the housing 200. A pump (not shown) that maintains the interior of the housing 200 at a process pressure during the process and a valve (not shown) that opens and closes a passage in the exhaust pipe are installed in the exhaust pipe.

The support member 220 may include a support plate 222 supporting the wafer W during the process. The support member 220 generally has a disc shape. A support shaft 224 rotatable by a motor 226 may be fixedly coupled to the bottom of the support plate 222. The wafer W may rotate during the process. The support member 220 may fix the wafer W by using a method such as electrostatic force or mechanical clamping.

The gas supply member 240 may supply a process gas into the housing 200. The gas supply member 240 may include a gas supply pipe 242 connecting the gas source 244 and the housing 200. A valve 242a that opens and closes a passage in the gas supply pipe 242 may be installed in the gas supply pipe 242.

The shower head 260 may uniformly disperse the process gas introduced into the housing 200 into an upper region of the support plate 222. The shower head 260 may be located to face the support member 220 in the upper portion of the housing 200. The shower head 260 may include an annular side wall 262 and a disc-shaped spray plate 264. The side wall 262 of the shower head 260 may be fixedly coupled to the housing 200 to protrude downward from an upper wall of the housing 200. The spray plate 264 is fixedly coupled to the lower end of the side wall. A plurality of spray holes 264a may be formed in the entire region of the spray plate 264. The process gas may be introduced into a space 266 provided by the housing 200 and the shower head 260, and then sprayed to the wafer W through the spray holes 264a.

A lift pin assembly 300 may load the wafer W to the support plate 222 or unload the wafer W from the support plate 222. The lift pin assembly 300 may include lift pins 322, a support plate 324, and a driver 326. Three lift pins 322 may be provided and fixed on the support plate 324 to move with the support plate 324. The support plate 324 has a disc shape and is located below the support plate 222 in the housing 200 or outside the housing 200. The support plate 324 may ascend and descend by the driver 326, such as a hydraulic cylinder or a motor. The lift pins 322 may be positioned correspondingly to vertices of a triangle when viewed from the top. Through holes that vertically penetrate the support plate 222 in the upward and downward direction may be formed in the support plate 222. Each lift pin 322 may be inserted into each through hole and ascends and descends through the through hole. Each lift pin 322 has a long rod shape, and the top thereof bulges upwards.

The plasma source 360 may generate the plasma from the process gas supplied to the upper region of the support plate 222. A capacitively coupled plasma may be used as the plasma source 360. The plasma source 360 may include an upper electrode 362, a lower electrode 364, and a power supply 366. The spray plate 264 of the shower head 260 may be made of a metal material and may function as an upper electrode 362. The lower electrode 364 is provided in the inner space of the support plate 222. The power supply 366 may apply high-frequency power (RF power) or microwave power to the upper electrode 362 or the lower electrode 364. The power supply 366 may apply power to each of the upper electrode 362 and the lower electrode 364. Power may be optionally applied to one of the upper electrode 362 and the lower electrode 364, and the other electrode may be grounded.

The magnetic field generating member 400 may be disposed on the housing 200 to provide a magnetic field in a region where the plasma is generated. A first magnet unit 420 may be located in the lower portion of the magnetic field generating member 400, and the second magnet unit 440 may be located in the upper portion of the magnetic field generating member 400. For example, the first magnet unit 420 may be disposed under the second magnet unit 440. In addition, the first magnet unit 420 and the second magnet unit 440 may be arranged apart from each other in a vertical direction (Z direction). For example, a range of the vertical separation distance between the first magnet unit 420 and the second magnet unit 440 may be about 1 mm to 30 mm.

In an embodiment, the first magnet unit 420 may include at least one first magnet 422, and the second magnet unit 440 may include at least one second magnet 442.

The first magnet 422 and/or the second magnet 442 may be permanent magnets. For example, the first magnet 422 may have a ring, donut and/or circular shape, and the second magnet 442 may have a sphere and/or cylindrical shape. If the first magnet 422 has a ring, donut, and/or circular shape, a magnetic field by the first magnet 422 may affect the wafer W and is symmetric to the center of the wafer W. For example, the center of the first magnet 422 may be aligned with the center of the wafer W and/or the center of the support member 220 in a vertical direction (Z direction). In another embodiment, from a vertical viewpoint, the center of the first magnet 422 may be aligned with an edge region of the wafer W.

The first magnet unit 420 and/or the second magnet unit 440 may be symmetric to the center of the wafer W. That is, the first magnet unit 420 and/or the second magnet unit 440 may be point symmetric to the center of the wafer W. Thus, the magnetic field generating member 400 including the first magnet unit 420 and the second magnet unit 440 may easily control the plasma.

When viewed from a plane, the first magnet 422 may surround the second magnet 442. A rotation shaft of the second magnet 442 may be a horizontal direction (X and/or Y direction) axis. If the rotation shaft of the second magnet 442 is a horizontal direction (X direction and/or Y direction) axis, the second magnet 442 may rotate such that the intensity of the magnetic field of the magnetic field generating member 400 is easily controlled.

The size of the magnetic field of the first magnet 422 and/or the second magnet 442 may be about 200 gauss (G) to about 1,000 G. Thus, the size of the magnetic field of the magnetic field generating member 400 may be about 1 G to about 2,000 G.

For example, the magnetic pole of the upper/lower portion of the first magnet 422 may be different from each other. For example, the lower portion of the first magnet 422 may be an N pole, and the upper portion of the first magnet 422 may be an S pole. For example, the lower portion of the first magnet 422 may be an S pole, and the upper portion of the first magnet 422 may be an N pole.

A minor diameter of the first magnet 422 may be, for example, about 10 mm to about 200 mm, and a major diameter of the first magnet 422 may be about 12 mm to about 240 mm. The major diameter of the first magnet 422 may be less than or equal to the diameter of the wafer W. The diameter of the wafer W may be, for example, about 150 mm, about 200 mm, about 450 mm, or more. The diameter of the first magnet 422 and/or the diameter of the second magnet 442 may change according to the diameter of the wafer W.

The rotating member 500 may be configured to rotate the second magnet unit 440. For example, the rotating member 500 may include a shaft 502 and an actuator 504. A rotational force of the actuator 504 may be transferred to the second magnet unit 440 through the shaft 502. For example, the rotation shaft of the second magnet 442 may be placed in parallel to the shaft 502. That is, the second magnet unit 440 may rotate by the movement of the actuator 504. The rotating member 500 is described as an assembly including the shaft 502 and the actuator 504 in the above examples, but an assembly of various structures may be used as the rotating member 500.

The controller 600 may be configured to adjust the intensity of the magnetic field of the magnetic field formation member 400 according to the degree of progress of the semiconductor process on the wafer W. The controller 600 may be implemented by hardware, firmware, software, or a combination thereof. For example, the controller 600 may be a computing apparatus such as a workstation computer, a desktop computer, a laptop computer, or a tablet computer. For example, the controller 600 may include a memory device, such as read only memory (ROM) or random access memory (RAM), and a processor configured to perform certain operations and algorithms, for example, a microprocessor, a central processing unit (CPU), or a graphics processing unit (GPU), and the like. In addition, the controller 600 may include a receiver and a transmitter for receiving and transmitting an electrical signal.

In an embodiment, for example, in order to generate a relatively strong magnetic field, the controller 600 may place the first magnet unit 420 and the second magnet unit 400 such that the magnetic force of the first magnet unit 420 and the second magnet unit 440 are constructive. For example, if the N pole of the first magnet unit 420 is placed at the lower portion of the first magnet unit 420, the controller 600 may place the N pole of the second magnet unit 440 at the lower portion of the second magnet unit. The second magnet unit 440 may be rotated by the rotating member 500. That is, the controller 600 may control the rotating member 500 to control the second magnet unit 440.

On the contrary, in order to generate a relatively weak magnetic field, the controller 600 may place the first magnet unit 420 and the second magnet unit 440 such that the magnetic force of the first magnet unit 420 and the second magnet unit 440 are destructive. For example, if the N pole of the first magnet unit 420 is placed at the lower portion of the first magnet unit 420, the controller 600 may place the N pole of the second magnet unit 440 at the upper portion of the second magnet unit. The second magnet unit 440 may be rotated by the rotating member 500.

A plasma processing apparatus of the related art lacks the technology to control the plasma in real-time, making it hard to control the plasma according to the state of a wafer. In addition, in the plasma processing apparatus of the related art, an electromagnet is placed on a housing to control the plasma. However, because the required intensity of a current applied to the electromagnet to control the plasma is relatively high, it is not easy to control the plasma.

The plasma processing apparatus 1000 according to the present embodiment may include a plurality of permanent magnets to easily control the plasma. In addition, the plasma processing apparatus 1000 according to the present embodiment may control the plasma in real-time. In addition, the plasma processing apparatus 1000 of the present embodiment may easily control the plasma of various regions on the wafer in real-time.

FIGS. 5A to 5D are each a graph showing a rotation velocity of the second magnet unit 440 over time, according to an embodiment.

Figure 5A:
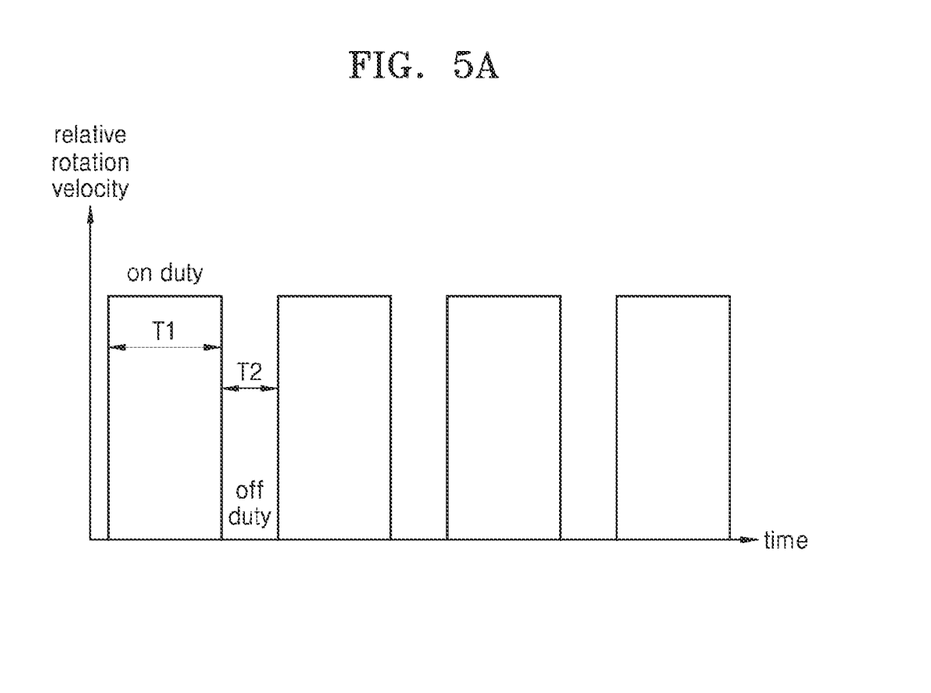
FIGS. 5A to 5D are each a graph showing a rotation velocity of a second magnet unit over time, according to an embodiment.
Figure 5B:
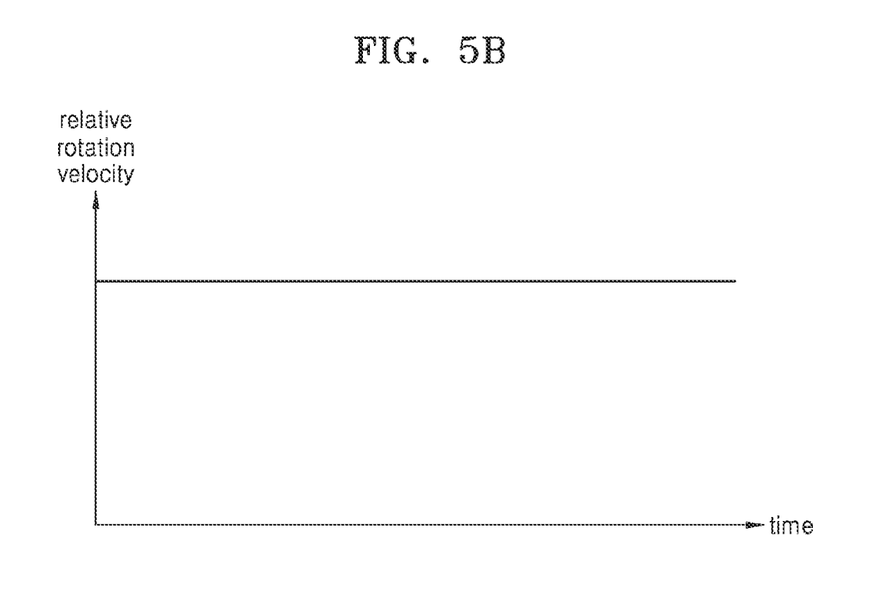
Figure 5C:
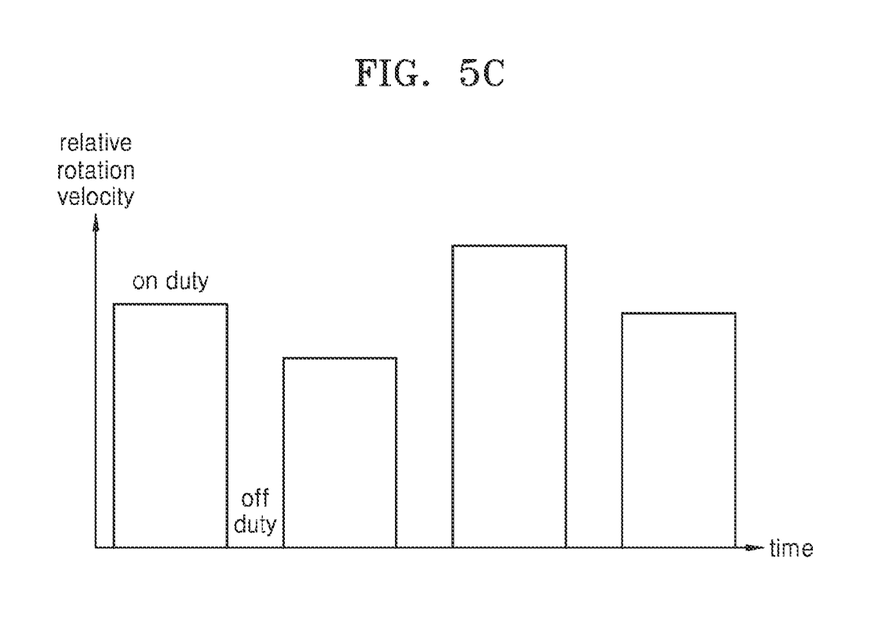
Figure 5D:
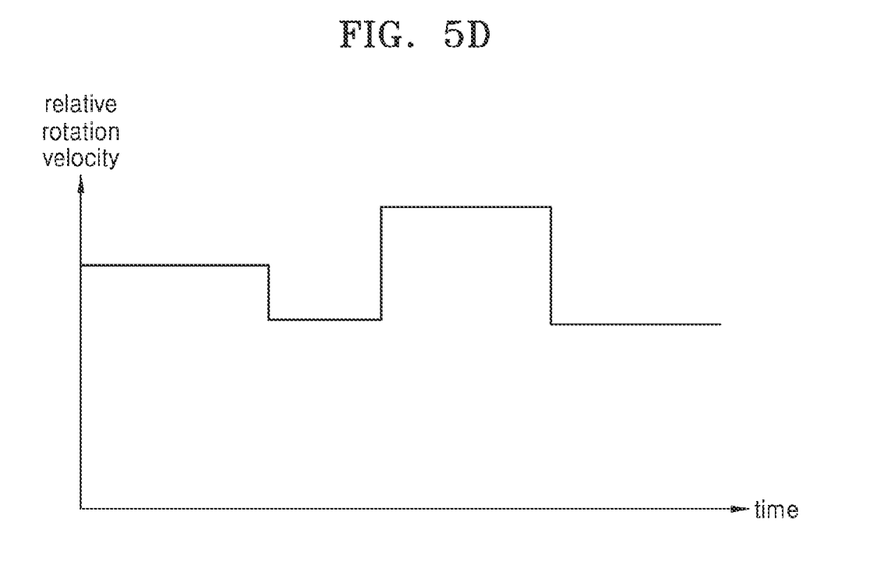

Referring to FIGS. 4 to 5D, to supply plasmas of various intensities to the inside of the housing 200, the controller 600 may change the intensity of the magnetic field of the magnetic field generating member 400. For example, the controller 600 may control the rotating member 500 to generate an on duty signal that controls the second magnet 442 to rotate and an off duty signal that controls the second magnet 442 not to rotate. In an embodiment, the controller 600 may control the rotating member 500 such that the on duty signal and the off duty signal are alternately repeated. For example, the on duty signal may last about 0.1 seconds to about 10 seconds, and the off duty signal may last about 0.01 seconds to about 1 second. The duration of the on duty signal may be referred to as T1, and the duration of the off duty signal may be referred to as T2. In an embodiment, the duration T1 of the on duty signal may be greater than the duration T2 of the off duty signal.

Referring to FIG. 5B, the second magnet unit 440 may continue rotating at a constant rotation velocity. That is, the controller 600 may continue to transfer the on duty signal such that the second magnet unit 440 continues rotating.

Referring to FIG. 5C, that the on duty signal and the off duty signal are alternately repeated is the same as FIG. 5A. However, in FIG. 5C, the relative rotation velocity between the plurality of on duty signals may be different.

Referring to FIG. 5D, the second magnet unit 440 may continue rotating, but the rotation velocity thereof may be changed when necessary.

FIGS. 5A to 5D are each an example of the rotation velocity of the second magnet unit 440, and the duration of the on duty signal, the duration of the off duty signal, the rotation velocity etc. may be varied.

Figure 6:
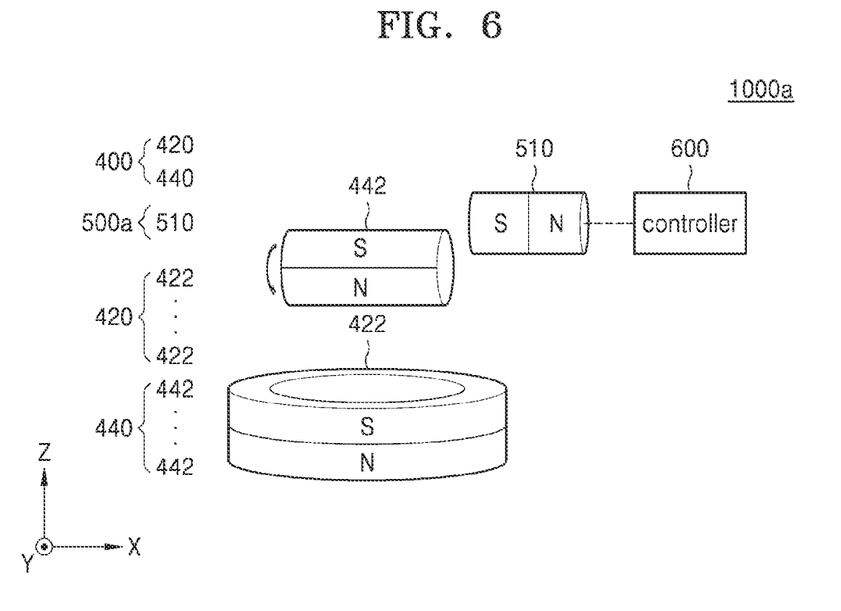
FIG. 6 is a schematic perspective view of a plasma processing apparatus including a rotating member, according to another embodiment.

FIG. 6 is a schematic perspective view of a plasma processing apparatus 1000*a* including a rotating member 500*a*, according to another embodiment.

Referring to FIG. 6, the plasma processing apparatus 1000*a* may include a magnetic field generating member 400 and a rotating member 500*a*. The rotating member 500*a* may include an electromagnet 510. The electromagnet 510 may include a coil (not shown). The coil may include copper, for example. A current may be applied to the coil to generate an inductive magnetic field on the electromagnet 510, and the second magnet unit 440 may be rotated by the induction magnetic field.

As described above, the controller 600 may control the current level and direction applied to the coil to control the rotation velocity and direction of the rotating member 500*a*.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A plasma processing apparatus, the apparatus comprising
    a housing defining a space accommodating a wafer therein;
    a gas supply member configured to supply gas into the housing;
    a plasma source generating a plasma from the gas supplied into the housing; and
    a magnetic field generating member disposed on the housing and configured to generate a magnetic field inside the housing, wherein the magnetic field generating member comprises:
        a first magnet unit disposed on the housing and including a first pole and a second pole; and
        a second magnet unit spaced from the first magnet unit and including a first pole and a second pole, wherein the second magnet unit is rotatable relative to the first magnet unit between a first position where the first pole of the second magnet opposes the first pole of the first magnet, and a second position wherein the second pole of the second magnet opposes the first pole of the first magnet.

2. The apparatus of claim 1, further comprising a controller configured to control a location of the first pole of the second magnet unit relative to the first magnet unit to control a size of the magnetic field of the magnetic field generating member.

3. The apparatus of claim 1, wherein the first magnet unit is positioned outside of the space defined by the housing.

4. The apparatus of claim 3, wherein the first magnet and the second magnet are permanent magnets.

5. The apparatus of claim 3, wherein
    the first magnet is symmetric to a center of the first magnet, and
    the second magnet is symmetric to a center of the second magnet.

6. The apparatus of claim 1, wherein the magnetic poles disposed in an upper portion and lower portion of the first magnet unit are different from each other.

7. The apparatus of claim 1, further comprising a rotating member configured to rotate the second magnet unit.

8. The apparatus of claim 1, wherein a rotation shaft of the second magnet unit defines a rotation axis which extends between the first pole and the second pole.

9. The apparatus of claim 1, wherein the first magnet unit and the second magnet unit are placed apart from each other in a vertical direction.

10. The apparatus of claim 1, wherein, when viewed from a plane, the first magnet unit surrounds the second magnet unit.

11. The apparatus of claim 1, wherein a surface of the first magnet unit facing the housing is flat.

12. A plasma processing apparatus, the apparatus comprising:
a housing defining a space accommodating a wafer therein;
a gas supply member configured to supply gas into the housing;
a plasma source generating a plasma from the gas supplied into the housing;
a magnetic field generating member disposed outside of the space defined by the housing and configured to generate a magnetic field inside the housing; and
a controller configured to control a size of the magnetic field of the magnetic field generating member, wherein the magnetic field generating member comprises:
a first magnet unit disposed on the housing;
a second magnet unit disposed adjacent the first magnet unit; and
a rotating member configured to rotate the second magnet unit, wherein the first magnet and the second magnet are permanent magnets, and wherein the controller controls a location of a magnetic pole of the second magnet unit relative to the first magnet unit to control a size of the magnetic field of the magnetic field generating member.

13. The apparatus of claim 12, wherein the rotating member comprises an actuator to transfer power and a shaft to transfer the power of the actuator to the second magnet.

14. The apparatus of claim 12, wherein
the rotating member comprises an electromagnet placed adjacent to a side of the second magnet, and
the controller controls a direction and intensity of the magnetic pole of the electromagnet to control the rotating member.

15. The apparatus of claim 12, wherein the controller alternately applies an on duty signal that rotates the second magnet unit and an off duty signal that does not rotate the second magnet unit to the rotating member.

16. The apparatus of claim 12, wherein
the first magnet has one of a ring shape, a donut shape, and a circular shape, and
the second magnet has one of a cylindrical shape and a sphere spherical shape.

17. The apparatus of claim 12, further comprising a substrate support member placed inside the space defined by the housing and supporting the wafer, wherein
a center of at least one of the first magnet unit and the second magnet unit is aligned with a center of the substrate support member in a vertical direction.

18. A plasma processing apparatus, the apparatus comprising:
a housing defining a space accommodating a wafer therein;
a substrate support member placed inside the space defined by the housing and supporting the wafer;
a gas supply member configured to supply gas into the housing;
a plasma source generating a plasma from the gas supplied into the housing;
a magnetic field generating member disposed on the housing and configured to generate a magnetic field inside the space defined by the housing; and
a controller configured to control the magnetic field generating member, wherein the magnetic field generating member comprises:
a first magnet unit disposed outside of the space defined by the housing,
a second magnet unit disposed adjacent the first magnet unit, and
a rotating member configured to rotate the second magnet unit relative to the first magnet unit, wherein
the first magnet and the second magnet are permanent magnets, and
the controller controls the rotating member to control a location of a magnetic pole of the second magnet unit relative to a magnetic pole of the first magnet unit to control a size of the magnetic field of the magnetic field generating member, and
a center of the magnetic field generating member is aligned with a center of the substrate support member in a vertical direction.

19. The apparatus of claim 18, wherein
the first magnet has a donut shape comprising a minor diameter and a major diameter,
the minor diameter ranges from about 50 mm to about 200 mm, and
the major diameter ranges from about 60 mm to about 240 mm.

20. The apparatus of claim 18, wherein the size of the magnetic field of each of the first magnet and the second magnet ranges from about 100 gauss to about 1,000 gauss.

* * * * *